(12) United States Patent
Ishida et al.

(10) Patent No.: US 7,126,152 B2
(45) Date of Patent: Oct. 24, 2006

(54) STORAGE DEVICE

(75) Inventors: Minoru Ishida, Tokyo (JP); Katsuhisa Aratani, Chiba (JP); Akira Kouchiyama, Kanagawa (JP); Tomohito Tsushima, Kanagawa (JP)

(73) Assignee: Sony Corporation, Tokyo (JP)

( * ) Notice: Subject to any disclaimer, the term of this patent is extended or adjusted under 35 U.S.C. 154(b) by 165 days.

(21) Appl. No.: 10/999,050

(22) Filed: Nov. 29, 2004

(65) Prior Publication Data

US 2005/0121697 A1  Jun. 9, 2005

(30) Foreign Application Priority Data

Dec. 3, 2003  (JP)  ............................ P2003-404088

(51) Int. Cl.
*H01L 29/06* (2006.01)
*H01L 29/08* (2006.01)
*H01L 39/00* (2006.01)

(52) U.S. Cl. ........................ 257/30; 257/595; 257/596; 257/E31.029

(58) Field of Classification Search ................ 257/30, 257/595, 596, E31.029
See application file for complete search history.

(56) References Cited

U.S. PATENT DOCUMENTS

2001/0013614 A1 * 8/2001 Joshi et al. .................. 257/295
2001/0030340 A1 * 10/2001 Fujiwara ..................... 257/314
2002/0063337 A1 * 5/2002 Oizumi et al. .............. 257/762

* cited by examiner

*Primary Examiner*—Ngân V. Ngô
(74) *Attorney, Agent, or Firm*—Sonnenschein Nath & Rosenthal LLP

(57) ABSTRACT

A storage device includes a first electrode, a second electrode facing the first electrode, an inter-electrode material layer provided between the first electrode and the second electrode, and a voltage application unit applying a predetermined voltage to the first and the second electrodes. Furthermore, an oxidation-reduction active material changeable into an electrode reaction inhibition layer by applying voltages to the first and the second electrodes is contained in a region that is covered by an electric field, the electric field being generated when the voltage is applied, and the electrode reaction inhibition layer is either formed along an interface region between the second electrode and the inter-electrode material layer, or changes an area thereof, or disappears depending on an application condition of the voltage to the first and the second.

17 Claims, 10 Drawing Sheets

F I G. 3 A
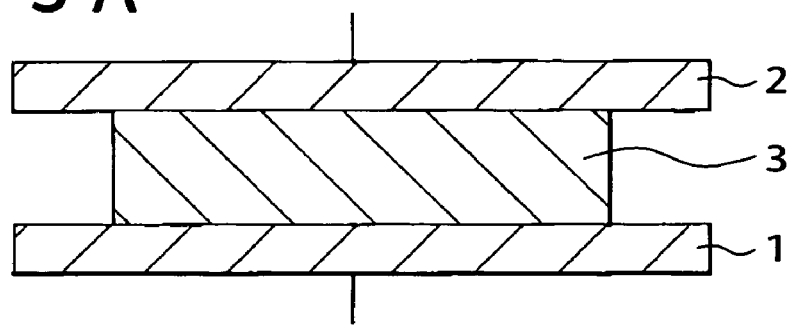
F I G. 3 B
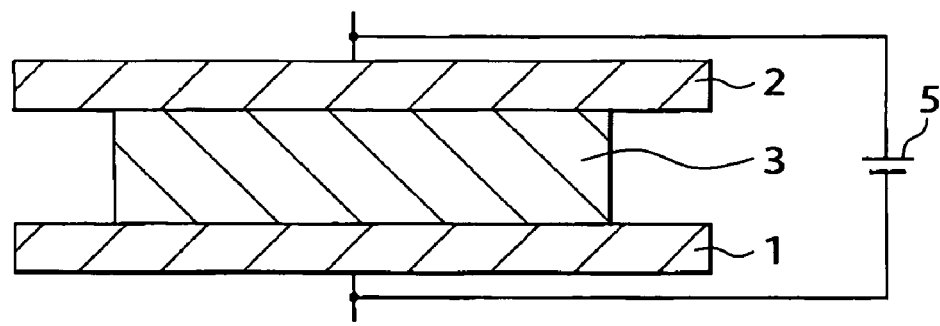
F I G. 3 C
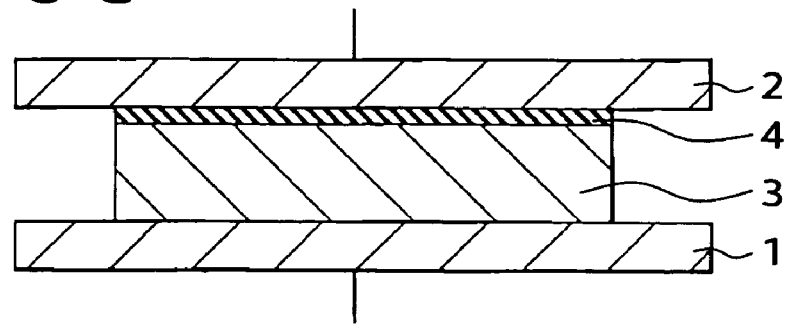

F I G. 4A
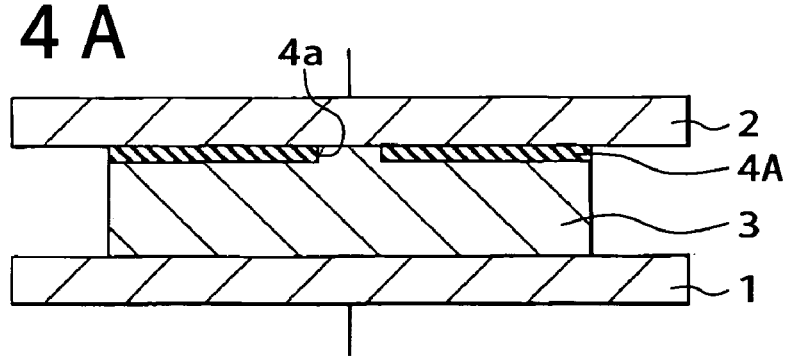
F I G. 4B
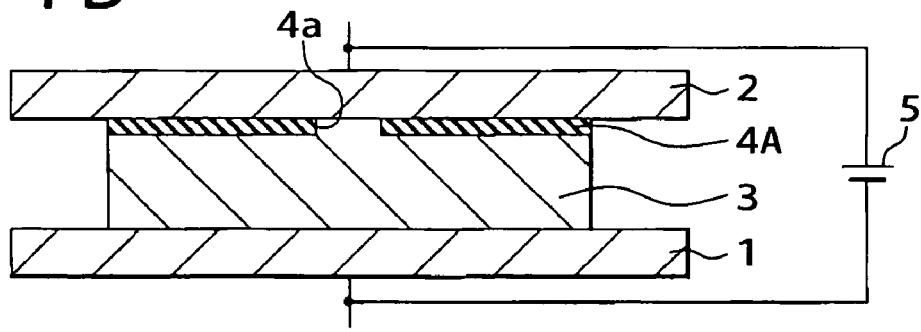
F I G. 4C
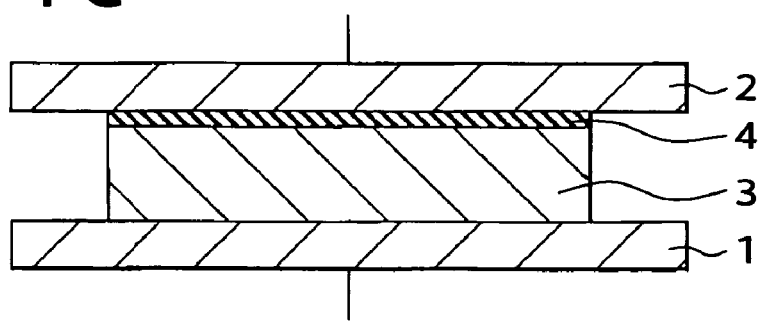

STORAGE DEVICE

CROSS REFERENCES TO RELATED APPLICATIONS

The present invention claims priority to its priority document No. 2003-404088 filed in the Japanese Patent Office on Dec. 3, 2003, the entire contents of which being incorporated by reference herein.

BACKGROUND OF THE INVENTION

1. Field of the Invention

The present invention relates to a storage device that is capable of performing a writing, a readout and an erasure of binary data (information) or data with more levels by changing electrical characteristics between two electrodes.

2. Description of the Related Art

In related art, a micro electronic programmable element as shown in FIGS. 12(A) and 12(B) is known as a storage element that may be formed easily with a simple structure (see Japanese Patent Application Publication 2002-536840). This element ionizes, by an application of a predetermined voltage, silver (Ag) contained in an inter-electrode material layer 103 between two electrodes 101 and 102, and forms, by a transfer of the ionized silver, an electron conduction path (channel) 104 that changes an electrical resistance between the above electrodes 101 and 102 to perform a writing of data.

In the element of related art, as a matter of convenience, a state in which a resistance between the two electrodes 101 and 102 before the application of the voltage is high is assumed to be a state in which data "0" is stored, and conversely, a state in which a diffusion of a metal ion toward the facing electrode by the application of the voltage results in a low resistance between the two electrodes 101 and 102 is assumed to be a state in which data "1" is stored, an operation of changing the element from the high resistance state to the low resistance state is referred to as a writing operation, and an operation of restoring the element from the low resistance state to the high resistance state is referred to as an erasure operation.

SUMMARY OF THE INVENTION

However, the storage element of the above structure of related art has some shortcoming on element characteristics in which a resistance value changes with a lapse of time, whereby leading to a failure to hold written data in stable manner. FIG. 13 shows changes of the resistance value over a lapse of time after the writing in the above storage element of related art in a case where the writing having been performed so as to satisfy a resistance state as low as a resistance value of 1 KΩ. In other words, the storage element of the related art has presented the shortcoming in which the written data, or the resistance value of the storage element having been changed from the high resistance state to the low resistance state causes a transition to the high resistance side with the lapse of time after the writing is brought close to the original state before the writing.

The storage element of related art as described above requires the formation of the electron conduction channel 104 with silver. More specifically, it requires the large current at the time of the writing, thereby resulting in an increase of power consumption.

Accordingly, it is desirable to provide a storage device that is capable of holding written data stably, and of performing a writing, a readout and an erasure of data with a current of a small magnitude. The present invention addresses the above, and other issues associated with the related art.

According to an embodiment of the present invention, a storage device is provided. The storage device includes: a first electrode; a second electrode facing the first electrode; an inter-electrode material layer provided between the first electrode and the second electrode; and a voltage application unit applying a predetermined voltage to the first and the second electrodes. Further, an oxidation-reduction active material changeable into an electrode reaction inhibition layer by applying voltages to the first and the second electrodes is contained in a region that is covered by an electric field, the electric field being generated when the voltage is applied, and the electrode reaction inhibition layer is either formed along an interface region between the second electrode and the inter-electrode material layer, or changes an area thereof, or disappears depending on an application condition of the voltage to the first and the second. The location of the electrode reaction inhibition layer is not limited to at the interface region between the second electrode and the inter-electrode material layer. Alternatively, the electrode reaction inhibition layer may be formed any arbitrary position within the inter-electrode material layer as long as it is formed along the interface region.

The oxidation-reduction active material layer may preferably include at least one component selected from a group consisting of nickel (Ni), cobalt (Co), chromium (Cr), titanium (Ti), tantalum (Ta), iron (Fe), aluminum (Al), vanadium (V), a reductant ($H_xWO_3$) of tungsten oxide ($WO_3$) and an oxide of the vanadium (V). The oxidation-reduction active material layer may exist either inside, or an inter-electrode material layer-side surface of the second electrode, or in a vicinity of the above surface.

In the storage device according to an embodiment of the present invention, an oxidation or a reduction of the oxidation-reduction active material depending on the application state of the voltage to the first and the second electrodes causes the electrode reaction inhibition layer to be formed along the interface region between the second electrode and the inter-electrode material layer or to disappear or alternatively, to increase or decrease the area thereof. The electrical characteristics between the first electrode and the second electrode vary depending on whether or not the electrode reaction inhibition layer exists at all or a difference in the area thereof, thereby allowing binary or more data to be stored in stable manner.

According to the storage device of the embodiments of the present invention, since the electrode reaction inhibition layer is formed along the interface region between the second electrode and the inter-electrode material layer or is allowed to disappear, or alternatively, increases or decreases the area thereof depending on the application condition of the voltage to the first and the second electrodes, the electrical characteristics between the first electrode and the second electrode vary depending on whether or not of the electrode reaction inhibition layer exists or a difference in the area thereof, thereby allowing the binary or more data to be stored in stable manner. The electrode reaction inhibition layer is formed by the oxidation of the oxidation-reduction active material. Accordingly, the layer is chemical stable, and as a result, the written data is held stably for a long period of time. Further, in the embodiments of the present invention, unlike the related art, there is no need to form an electron conduction channel made of silver, and the formation or the disappearance of an insulation film (the electrode reaction inhibition layer) is merely needed. Accordingly, the writing or the erasure of data may be achieved with a current of a smaller magnitude, whereby resulting in a considerable reduction of a power consumption.

BRIEF DESCRIPTION OF THE DRAWINGS

The above and other objects, features and advantages of the present invention will become more apparent from the following description of the presently exemplary embodiment of the invention taken in conjunction with the accompanying drawings, in which:

FIGS. 3A to 3C are a sectional view for illustrating a data writing operation of the storage device according to the first embodiment;

FIGS. 4A to 4C are a sectional view for illustrating a data writing operation of the storage device according to the second embodiment;

DETAILED DESCRIPTION OF THE EMBODIMENTS

Embodiments of the present invention are hereinafter described in detail with reference to the accompanying drawings.

First Embodiment

Figure 1A:
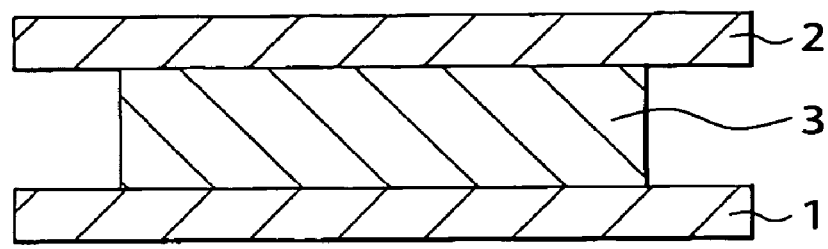
FIGS. 1A and 1B are a sectional view showing a configuration of a storage device according to a first embodiment of the present invention.
Figure 1B:
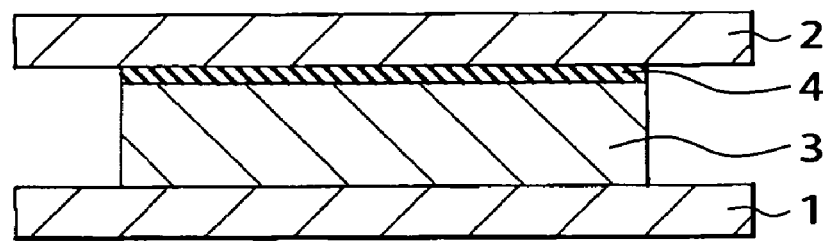

FIGS. 1(A) and 1(B) show a main configuration of a storage device according to a first embodiment of the present invention. Although it is not shown in the figure, the storage device includes a plurality of storage elements that may be, for example, arranged in a matrix form. The storage element has a structure having an inter-electrode material layer 3 sandwiched between a pair of electrodes 1 and 2 (a first and a second electrodes) facing each other, and is provided with a voltage application unit (not shown) for applying a predetermined voltage to the electrodes 1 and 2. Each of the plurality of storage elements has, in a corresponding arrangement, an active element or a transistor (not shown in the figure) for controlling electrical access to each element, thereby completing the configuration of the memory cell. Each storage element contains an oxidation-reduction active material A extended in a range over which an electric field produced at the time of an application of the voltage to the electrodes 1 and 2 covers. The oxidation-reduction active material A is oxidized or reduced depending on the application condition of the voltage such that the electrode reaction inhibition layer 4 is formed or disappears along an interface region between the electrode 2 and the inter-electrode material layer 3.

In other words, the storage device of the first embodiment of the present invention is operative to store binary data by utilizing a change of electrical characteristics between the electrodes 1 and 2 by means of physical or chemical characteristic change between the above electrodes depending on whether or not the electrode reaction inhibition layer 4 is formed therein. Further, by utilizing a change in an area of the electrode reaction inhibition layer 4 in addition to mere existence of the electrode reaction inhibition layer 4, a mode of storing ternary or more data may be realized.

The oxidation-reduction active material A is a material that changes into the electrode reaction inhibition material layer 4 by the oxidation of the material A itself and may cause changes in the electron conductivity, ion conductivity and capacitance by inhibiting an electron transfer reaction between external ions and the electrode. More specifically, the material A may include metals such as nickel (Ni), cobalt (Co), chromium (Cr), titanium (Ti), tantalum (Ta), iron (Fe), aluminum (Al) and vanadium (V), or semiconductors such as silicon (Si) and germanium (Ge). Further, a reductant ($H_xWO_3$) of tungsten oxide ($WO_3$) or an oxide of vanadium (V) has the same or similar function as the above element, and thus may be also used as the oxidation-reduction active material A.

An electrode reaction inhibition material B contained in the electrode reaction inhibition material layer 4 is a material such that, even if a positive potential sufficient to effect a reaction of causing, through an ionization into cations, an elution of silver contained in the electrode 1 as described later is applied to the electrode 1, the material can inhibit a reaction (a precipitation reaction) of causing a precipitation of the ionized silver through accepting electrons from the facing electrode 2, or such that, although the electron transfer reaction takes place, makes it difficult to effect the electron transfer reaction as compared with a case where the electrode reaction inhibition material B is absent. In the first embodiment, nickel oxide (NiO) prepared by oxidizing, on an anode electrode (when a potential of the electrode 2 is positive), the oxidation-reduction active material (nickel in this case) A contained in the electrode 2 is served as the electrode reaction inhibition material B.

Positions and modes of which the oxidation-reduction active material A is contained may be classified as follows.
(1) One of the electrodes 1 and 2 is formed with the oxidation-reduction active material A itself, or the oxidation-reduction active material A is contained in the electrode 1 or 2.
(2) The oxidation-reduction active material A is contained in both the electrodes 1 and 2, and a content or a concentration of the material A in the electrode 1 is different from that of the electrode 2.

(3) The oxidation-reduction active material A exists at a surface of one of the electrodes 1 and 2 or in a vicinity of the surface, or alternatively, in a region (in the inter-electrode material layer) that is covered by an electric field generated at the time of the application of the voltage for the writing process even if the region is distant from the surface.

For example, when the electrodes 1 and 2 are formed with an electrode material such as aluminum (Al) and tungsten titanium (TiW) available for a typical semiconductor device, the oxidation-reduction active material A may be formed in such a way that the material A exists at one electrode surface at a side being in contact with the inter-electrode material layer 13. Further, if a part of the electric field generated at the time of the application of the voltage (a writing voltage) for writing the data in the storage element reaches the oxidation-reduction active material A, the oxidation-reduction active material A may exists in an intermediate region of the inter-electrode material layer 13. In such a case, the oxidation-reduction active material A may be connected to the electrodes 1 and 2 through a low resistant or a high resistant material.

(4) The oxidation-reduction active material A exists at the surfaces of both the first and the second electrodes 1 and 2, or in the vicinity of the surfaces, or alternatively in the region that is covered by the electric field generated at the time of the application of the voltage for the writing even if the region is distant from the surfaces. Further, the content or the concentration of the material at the surface of the electrode 1 or in the vicinity of the surface or in the region that is covered by the generated electric field is different from that at the surface of the electrode 2, or in the vicinity of the surface, or in the region that is covered by the generated electric field.

The first embodiment of the present invention is now described by taking an exemplary case of the mode (the above (1)) in which the electrode 2 is formed with the oxidation-reduction active material A (nickel, for instance).

The electrode 1 is formed with an oxidizable/reducible conductive material such as silver (Ag), for instance. A cation obtained by the oxidation of the above material is hereinafter referred to as an elution ion. In this case, the cation (the elution ion) is assumed to be $Ag^+$ of one valence. The electrode 1 may be formed with copper (Cu) instead of silver, or may be one containing the above oxidation/reduction seed in an electrode matrix material such as aluminum (Al). While a film thickness of each of the electrodes 1 and 2 may be about as large as that required for a typically available semiconductor device, the electrodes 1 and 2 used herein respectively have a film thickness of 100 nm, for instance.

The inter-electrode material layer 3 is an ion conductive layer provided between the electrodes 1 and 2, and is formed with a material such as GeSbTeGd that has, as a matrix material, an amorphous thin film containing a chalcogenide material such as oxygen (O), sulfur (S), selenium (Se) and tellurium (Te) and at least one component selected from a group consisting of germanium (Ge), silicon (Si), antimony (Sb) and indium (In). A film thickness thereof is 70 nm, for instance. The inter-electrode material layer 3 is one obtained by annealing in a mixed atmosphere including nitrogen and oxygen, for instance, after being formed by a sputtering, for instance. Alternatively, the electrode 1 may also be formed with a material containing no oxidation/reduction seed described above by adding the oxidation/reduction seed such as silver and copper to the inter-electrode material layer 3.

The first embodiment of the present invention perform the writing of data with the electrode reaction inhibition layer 4 formed on the surface of the electrode 2 as shown in FIG. 1(B) by the application of the predetermined voltage to the electrodes 1 and 2. A detailed operational effect of the first embodiment is described later together with that of a second embodiment.

Second Embodiment

Figure 2A:
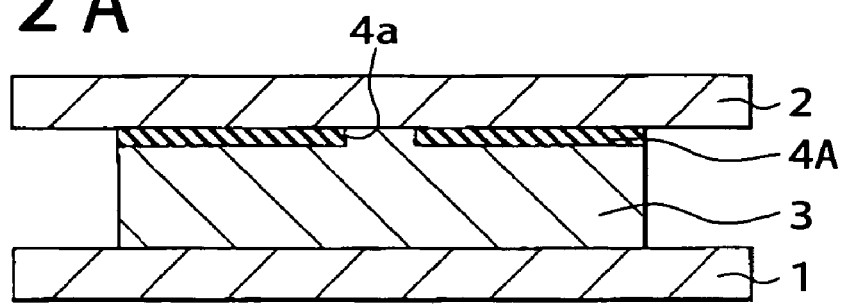
FIGS. 2A and 2B are a sectional view showing a configuration of a storage device according to a second embodiment.

FIG. 2(A) shows a second embodiment of the present invention, in which the element with the structure shown in FIG. 1(A) has the electrode reaction inhibition layer 4A with an opening 4a in a part thereof. The electrode reaction inhibition layer 4A including the above electrode reaction inhibition material B (nickel oxide (NiO) in this case) is formed in advance on a surface of one of the electrodes, for example the second electrode 2.

The electrode reaction inhibition layer 4A may be obtained by, after a formation of the electrode reaction inhibition layer 4 (nickel oxide) over the whole surface of the electrode 2 in the element of the structure shown in FIG. 1(A) by oxidizing nickel contained in the electrode 2 by the application of a negative potential than that of the second electrode 2 to the electrode 1, applying a positive potential than that of the electrode 2 to the electrode 1. Thus, a part or most of the electrode reaction inhibition layer 4 is destroyed or disappears, thereby forming the electrode reaction inhibition layer 4A with the opening 4a. The application of the positive potential than that of the electrode 2 to the electrode 1 results in precipitation of silver ions having been eluted from the electrode 1 on the electrode 2, the negative potential (provided that an absolute value of the potential is smaller than that obtained in the case of a growth of the electrode reaction inhibition material) than that of the electrode 2 is applied to the electrode 1 to ensure that the oxidation-reduction active material A having precipitated on the electrode 2 is eluted into the inter-electrode material layer 3.

Specifically, after the formation of the electrode reaction inhibition layer by the application of a potential lower by minus 1 V than that of the electrode 2 to the electrode 1, a potential higher by plus 0.8 V than that of the electrode 2 is applied to the electrode 1 to destroy a part of the electrode reaction inhibition layer 4, and thereafter, a potential lower by minus 0.4 V than that of the electrode 2 is applied to the electrode 1 to elute the nickel oxide having participated on the electrode 2. Accordingly, the electrode reaction inhibition layer 4A having the opening 4a as shown in FIG. 2(A) may be formed.

The storage element in the first and the second embodiments described above performs a data writing process by forming the electrode reaction inhibition layer 4 over the whole region of the interface between the electrode 2 and the inter-electrode material layer 3 by the application of a predetermined voltage as described later to the electrodes 1 and 2, thereby allowing data to be stored depending on whether or not the electrode reaction inhibition layer 4 exists. In other words, the application of the voltage to the electrodes 1 and 2 causes a change of valence of the oxidation-reduction active material A (into the electrode reaction inhibition material B) contained in the electrode 2. The oxidation-reduction active material A, even after being changed into the electrode reaction inhibition material B with the change of valence, remains substantially in the same place as that of prior to the change of the valence. Such a change of valance results in a change of electrical characteristic (electron conductivity, impedance or capacitance)

between the electrodes 1 and 2. The change of electrical characteristic described above allows one bit or more data to be stored between the electrodes 1 and 2. Likewise, the change of valence in the oxidation-reduction active material A also results in a change of ion conductivity between the electrodes 1 and 2. Accordingly, the change of ion conductivity allows data to be stored. The same may be also applied to a case of a determination performed by the application of a predetermined voltage when reading out data, which will be described later, so that the determination of the data may be performed depending on a difference of the electron conductivity, etc.

Figure 11:
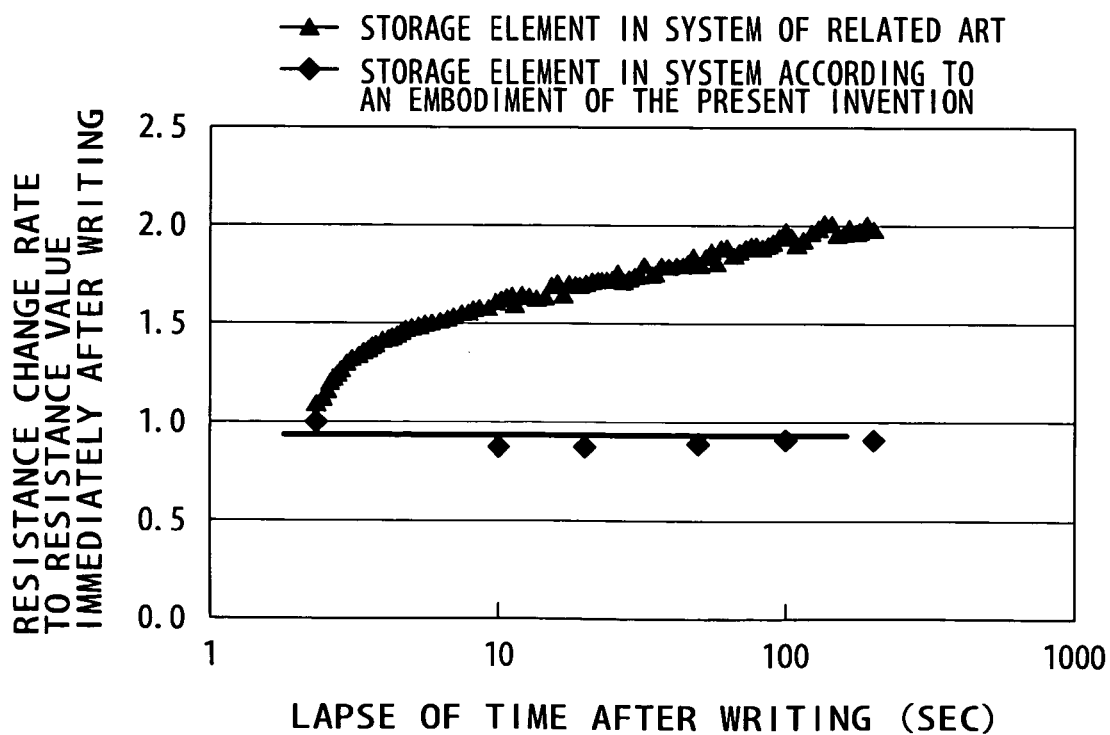
FIG. 11 is a graph showing data holding characteristics of the storage device according to an embodiment of the present invention as compared with a storage device of related art.
Figure 12A:
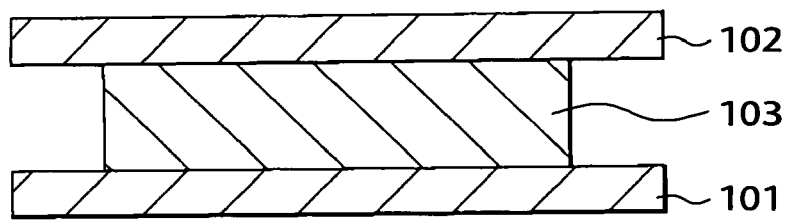
FIGS. 12A and 12B are a sectional view showing a configuration of the storage device of related art.
Figure 12B:
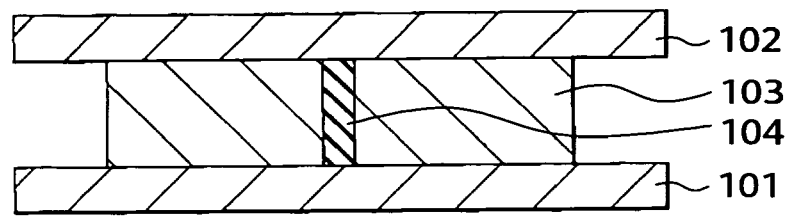
Figure 13:
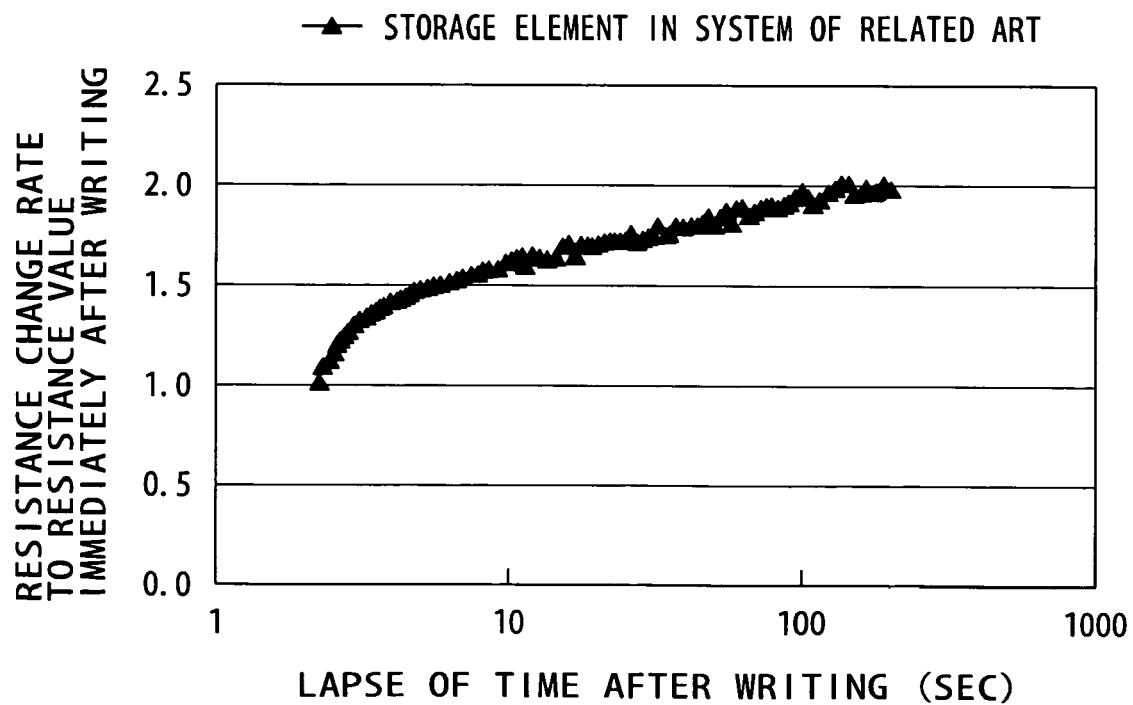
FIG. 13 is a graph showing the data holding characteristics of the storage device of related art.

FIG. 11 shows an evaluation result obtained by a measurement on a change rate of a resistance value to a lapse of time after the writing in the same manner as that of the above evaluation shown in FIG. 13, together with the evaluation result in the case of the storage element of the structure of the related art shown in FIG. 12.

As can be seen from FIG. 11, the storage element having the structure of related art has presented the issue in which the resistance value of the element having performed the writing of data so as to change the resistance to the low resistance state causes a transition to a direction of a high resistance value with the lapse of time after the writing, whereas the storage element according to the embodiments of the present invention causes almost no change in the resistance value with the lapse of time after the writing.

This may be attributed to the following. First of all, the writing and erasing mechanisms of the storage element in a system of related art are described with reference to the previously described FIGS. 12(A) and 12(B).

For the writing of data in the storage element in the related art system, a voltage sufficient to allow the material (silver) contained in the electrode 101 to be oxidized, in other words, ionized into cations, or a voltage higher by about plus 0.2V than that applied to the electrode 102 is applied to the electrode 101. Accordingly, the silver contained in the electrode 101 is ionized and eluted into the inter-electrode material layer 103 between the electrodes 101 and 102. The ion having been eluted into the inter-electrode material layer 103 re-precipitates through the acceptance of electrons from the electrode 102-side, after the transfer toward the facing electrode A (the electrode 102), or alternatively, precipitates in re-combination with the electrons flowing from the electrode 102-side through the inter-electrode material layer 103, which is in the high resistance state, in between the two electrodes 101 and 102. As a result, a long strip of conduction path (an electron conduction channel 104), through which electrons moves from the electrode 102-side to an elution electrode (the electrode 101), is formed. The writing of data is achieved in this state.

For the erasure of written data from the storage element in the related art system, a voltage sufficient to allow the precipitated silver to be re-eluted, through the ionization into cations, into the inter-electrode material layer 103, or a voltage lower by about minus 0.2V than that applied to the electrode 102 is applied to the electrode 101 to cause a disconnection or a disappearance of a part or the whole of the electron conduction channel 104 formed by the precipitation of silver. Thus, the data is erased.

Next, in the case of the storage element in the related art system, a state in which no formation of the electron conduction channel 104 causes the high resistance between the electrodes 101 and 102 (the state shown in FIG. 12(A)) is assumed as the state in which the data "0" is stored, and conversely, a state in which the above writing process results in a low resistance between the electrodes 101 and 102 (the state shown in FIG. 12(B)) is assumed as the state in which the data "1" is stored. The storage of one bit data is attained with either of the above two states taken. While no damage is of course given to a function of the storage device even if the high resistance state is taken as the state in which the data "0" is stored and the low resistance state is taken as the state in which the data "1" is stored, the present specification defines the data storage states as those described above, as a matter of convenience.

In the case of the storage element in the related art system as described above, the following two requirements may be satisfied in order to have excellent data holding characteristics, or to keep the state shown in FIG. 12(A) when the data "0" is stored, and to keep the state shown in FIG. 12(B) when the data "1" is stored. However, while it is supposed to be relatively easy to keep the state shown in FIG. 12(A), it is difficult to keep the state in which the electron conduction channel 104 shown in FIG. 12(B) remains as it was formed. The reasons thereof are described in the following.

When silver having precipitated from the electrode 101 in the electron conduction channel 104 is in high concentration, an inter-silver atomic distance inside of the electron conduction channel 104 is small. Accordingly, a relatively strong inter-atomic force acts on between the silver atoms. Thus, the silver atoms having precipitated into the electron conduction channel 104 remain as they are inside of the electron conduction channel 104 stably for a long period of time. Accordingly, the state shown in FIG. 12(B) is maintained. However, when the silver inside of the electron conduction channel 104 is in low concentration, the resistance of the electron conduction channel 104 is increased. This may pose a problem when forming a semiconductor storage device of a high level of integration by utilizing a semiconductor manufacture process, for instance.

Typically available semiconductor storage devices such as a DRAM (Dynamic Random Access Memory) and SRAM (Static Random Access Memory), for instance, have a semiconductor storage element array formed by longitudinal and horizontal arrangements of a plurality of elements so as to meet requirements for the higher level of integration. In this case, in order to prevent erroneous application of the writing or the erasing to a storage element other than a target storage element when performing the writing into or the erasing from the certain storage element, the array has, for each one bit of the storage element, an access transistor for controlling access to the target element.

However, in case of a normal MOS-type semiconductor process, a transistor's On-resistance is as low as 2.0 k$\Omega$ per transistor width of 1 μm in the generation of ground design rule of 150 nm with a power supply voltage of 1.2 V, and 1.5 k$\Omega$ per transistor width of 1 μm in the generation of ground design rule of 70 nm with the power supply voltage of 0.9 V (the source of quotations: 2002 edition of ITRS ("International Technology Roadmap for Semiconductors", Data on a mobile apparatus LSI (LOP) in a roadmap of system drivers and a roadmap of design. URL of ITRS: http://public.itrs.net/).

For the writing of data in the storage element in the related art system, or the formation of the electron conduction channel 104 of a low resistance, a supply of a current of 1 mA or above at the time of the application of at least the writing voltage (the voltage applied to the electrode 101 is higher by plus 0.2 V than that applied to the electrode 102) is required to form the electron resistance channel 104 of 200 $\Omega$, for instance. Likewise, the supply of the current of 1 mA or above is required to perform the erasure of data, or the elution of the electron conduction channel 104 by the application of the erasing voltage (the voltage applied to the electrode 101 is lower by minus 0.2 V than that applied to the electrode 102) to the storage element in the related art system having the electron conduction channel 104 of 200 Ω, for instance. The supply of the current of a magnitude as large as that described above using the access transistor of the above on-resistance requires an access transistor having a transistor width of 1.7 µm in either generation case of the ground design rule of 150 nm or 70 nm. The transistor width as described above is not adaptable to the formation of the storage device of the high integration at all.

When using an access transistor of a transistor width of 70 nm in case of the generation of ground design rule of 70 nm, a current that may be supplied to the storage element through this access transistor is about as much as 40 µA. If a threshold value that effects the writing and erasing reactions is assumed to be 0.2 V, a resistance value of the element for the writing and the erasing may be as high as 5 kΩ at the most in case of a current supply capability described above.

When the resistance value of the electron conduction channel 104 formed with silver is as high as that described above, the concentration of the silver contained in the electron conduction channel 104 is low. Accordingly, the inter-atomic force acting between the silver atoms is reduced with an increase of the inter-silver atomic distance. As a result, the silver atoms having precipitated into the electron conduction channel 104 will not stay therein and are transferred discretely into the inter-electrode material layer 103 with the lapse of time, or the state shown in FIG. 12(B) fails to be maintained.

As a reference, the inventors of the present invention performed an evaluation on the data holding characteristics of the storage element in the related art system having the electron conduction channel 104 of 1 kΩ that is considered to be excellent in the data holding characteristics because of the resistance lower than the above estimation. A result of the above evaluation is shown in the previously described FIG. 13, in which the written data in the element, or the resistance value of the storage element having been changed from the high resistance state to the low resistance state changed to the high resistance side with the lapse of time after the writing.

As described above, the storage element in the related art system is operative to store one bit data with the state (the state shown in FIG. 12(A)) in which no formation of the electron conduction channel 104 causes the high resistance between the electrodes 101 and 102, and the state (the state shown in FIG. 12(B)) in which the above writing process results in the low resistance between the electrodes 101 and 102 due to the electron conduction channel 104. However, the data holding characteristics (or a stability of the electron conduction channel 104 with the low resistance) of the written data were not satisfactory.

Figure 2B:
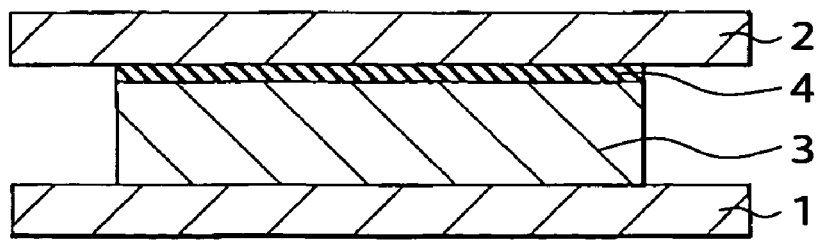

On the other hand, in the embodiments of the present invention, the storage of one bit data is performed by utilizing the state (the state shown in FIG. 1(A) (the first embodiment) or in FIG. 2(A) (the second embodiment)) in which the resistance between the electrodes 1 and 2 is low, and the state (the state shown in FIG. 1(B) (the first embodiment) or in FIG. 2(B) (the second embodiment)) in which the formation of the electrode reaction inhibition layer 4 over the whole interface between the electrode 2 and the inter-electrode material layer 3 results in the high resistance between the electrodes 1 and 2. Accordingly, the embodiments of the present invention allow, in the state in which the data "1" is stored, the electrode reaction inhibition layer 4 of the high resistance to be formed over the whole surface of the electrode 2, while no electron conduction channel of the low resistance is formed, unlike the element of the related art. In the second embodiment in which, although the electrode reaction inhibition layer 4A is formed, the area thereof is smaller because of the presence of the opening 4a, the data "0" is in a relatively lower resistance state as compared with the state in which the data "1" is stored.

For exhibition of excellent data holding characteristics, the storage element in the related art system is required to keep the states shown in FIGS. 12(A) and 12(B) as described above, whereas the embodiments of the present invention are required to keep the states shown in FIG. 1(A) or 2(A) and FIG. 1(B) or 2(B). With regard to this issue, the embodiments of the present invention eliminate the need to keep the state in which the thin electron conduction channel 104 remains as it was formed inside of the inter-electrode material layer 103, unlike the related art system, and the electrode reaction inhibition layer 4 is merely needed to remain as it is over the whole interface between the electrode 2 and the inter-electrode material layer 3. The electrode reaction inhibition layer 4 is formed with the chemically stable material (nickel oxide (NiO)), and is thus ensured to remain as it is stably for a longer period of time. Accordingly, it becomes possible to keep the state shown in FIG. 1(B) or 2(B).

Next, the writing, the readout and the erasure of data in the embodiments of the present invention are described in detail.

Writing Process

The writing operation in the first embodiment is firstly described with reference to FIGS. 3(A) to 3(C), and a description on the writing operation in the second embodiment with reference to FIGS. 4(A) to 4(C) follows. The electrode 1 is formed with silver (Ag), and the electrode 2 is formed with nickel (Ni) as described above. The nickel corresponds to the oxidation-reduction active material A.

For the element in the state (in which the data "0" is stored) shown in FIG. 3(A) in the first embodiment, the application of a voltage substantially higher than that of the electrode 1 to the electrode 2, or a voltage higher by about 1V than that of the electrode 1, using a DC power source 5 causes the oxidation-reduction active material (nickel) contained in the electrode 2 to be oxidized into an oxidant (electrode reaction inhibition material B) such as a nickel oxide and a nickel hydroxide, as shown in FIG. 3(C). The formation of the electrode reaction inhibition layer 14 including the electrode reaction inhibition material B results in the change of the electrical characteristics. Accordingly, the electron conductivity or the ion conductivity in the region containing the electrode reaction inhibition layer 14 is decreased, thereby causing the capacitance in this portion to be increased. As described above, the change of the electrical characteristics is caused by the formation of the electrode reaction inhibition layer 14, and the resultant high resistance state serves as the state in which the data "1" is stored.

Further, the formation of the above electrode reaction inhibition layer 14 also causes the following change of the electrical characteristics, independent of the above change. The electrode reaction inhibition layer 14 is effective in hindering the electron conduction, and also preventing a matter at an outside of the electrode 2 from being transferred close to the electrode 2, so that a reaction accompanied by the electron transfer between the electrode 2 and the outside thereof is inhibited. In other words, an electrode reaction that takes place in the case of the absence of the electrode reaction inhibition layer 14 is inhibited, such as a reaction in which an ion, an oxidation-reduction active atom or an oxidation-reduction active molecule existing at the outside of the electrode 2 is oxidized by itself through the application of electrons to the electrode 2, or is reduced by itself through the acceptance of electrons from the electrode 2.

The electrode reaction inhibition layer 4 having the above functions is preferably formed over the whole interface region between the electrode 2 and the inter-electrode material layer 3 as shown in FIG. 3(C), or alternatively, may be formed only in a part of the interface region. It is, however, to be understood that the electrode reaction inhibition layer 4 is preferably required to cover the half or more of the area of the interface region to obtain the stable electrical characteristics.

On the other hand, the second embodiment has the electrode reaction inhibition layer 4A in advance along the interface between the electrode 2 and the inter-electrode material layer 3, and the electrode reaction inhibition material (FIG. 4(A)) is partially contained, so that the application of the positive potential than that of the electrode 1 to the electrode 2 as shown in FIG. 4(B) causes the area of the interface between the electrode 2 and the inter-electrode material layer 3 in the region covered with the electrode reaction inhibition material to be increased as shown in FIG. 4(C), thereby forming the electrode reaction inhibition layer 4.

As described above, an approach to the writing of data in the embodiments of the present invention is to change the electron conductivity, the ion conductivity or the capacitance in the interface between the electrode and the inter-electrode material layer 3 into a state different from the previous one to the writing operation by forming the electrode reaction inhibition layer 4, or by increasing the area of the region covered with the electrode reaction inhibition layer 4.

Readout Process

Next, an operation in the first embodiment at the time of the readout of data from the storage element having performed the writing as described above is described with reference to FIGS. 5(A) to 5(D) and 6(A) to 6(D).

Figure 5A:
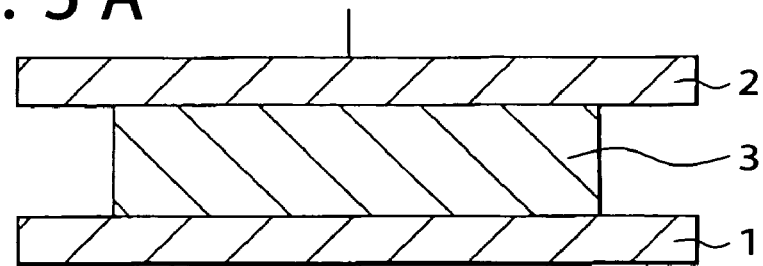
FIGS. 5A to 5D are a sectional view for illustrating a readout operation of data "0" in the storage device according to the first embodiment.
Figure 5B:
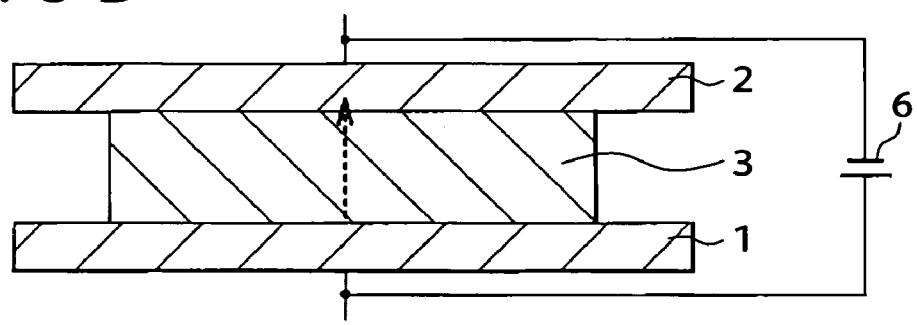

For the readout from the storage element (FIG. 5(A)) in a non-writing state (the state in which the data "0" is held), first, a potential sufficient to allow the silver contained in the electrode 1 to be eluted, through the ionization, into the inter-electrode material, or a potential higher by about 0.5 V than that of the electrode 2 is applied to the electrode 1 using a DC power source 6, as shown in FIG. 5(B). The silver is ionized and eluted from the electrode 1, so that the eluted silver ion $Ag^+$ precipitates as silver atoms through the acceptance of electrons from the electrode 2, after the transfer toward the electrode 2 as shown by an arrow (a broken line) in the drawing. When the above reaction takes place by the above mechanisms, an ion current containing the silver ions as means of a charge transfer flows from the electrode 1 to the electrode 2. The current that flows at this time has a magnitude larger than that of a current that flows in the case of the readout of the data "1" as described later (FIG. 6(B)).

Figure 5C:
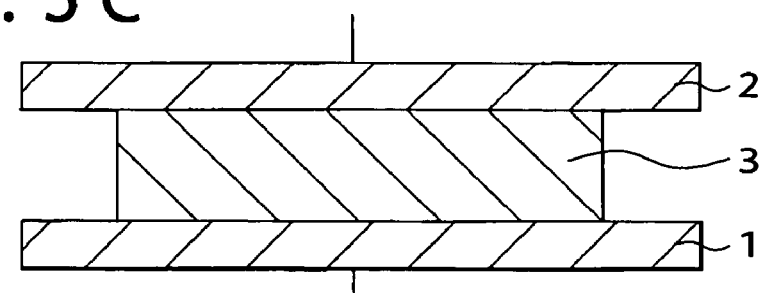
Figure 5D:
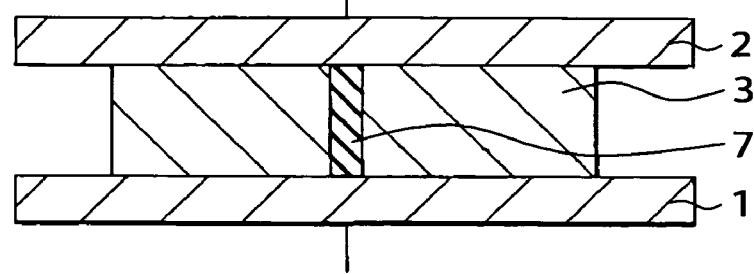
Figure 6A:
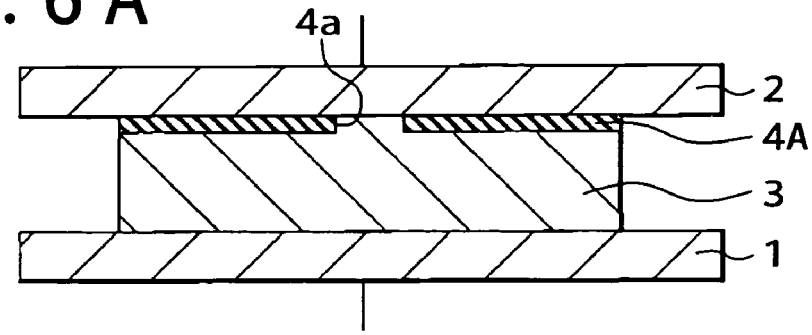
FIGS. 6A to 6D are a sectional view for illustrating the readout operation of the data "0" in the storage device according to the second embodiment.
Figure 6B:
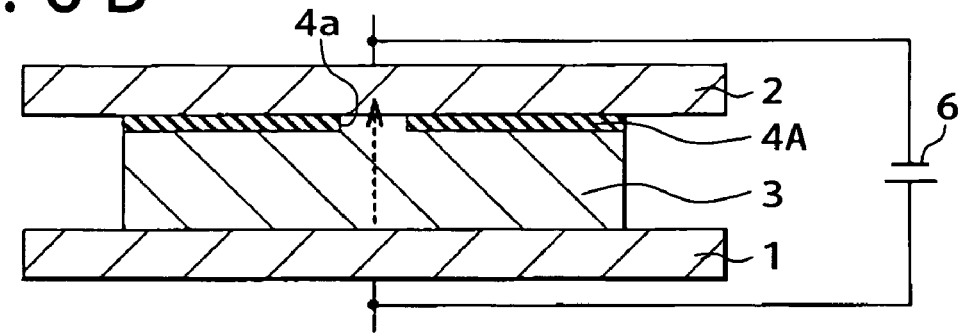
Figure 6C:
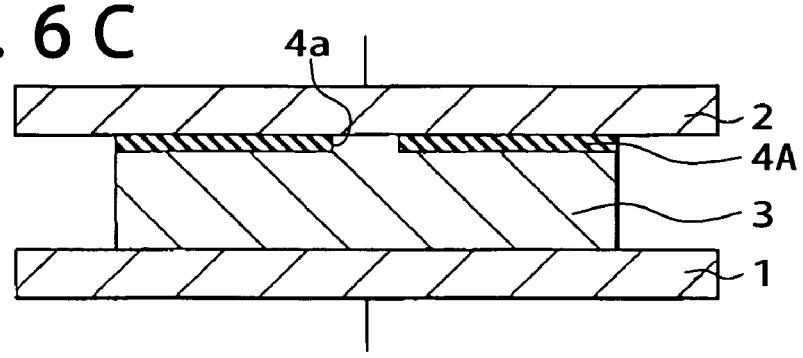
Figure 6D:
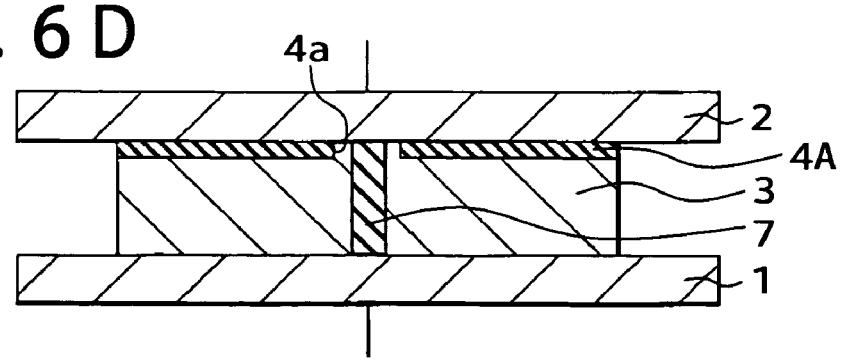

When the current of a relatively small magnitude flows, the ion conduction channel (FIG. 5(C)) is not formed. Conversely, when the current of a relatively large magnitude flows, the electron conduction channel 7 is formed with the precipitated silver as shown in FIG. 5(D) to allow the current to flow through the electron conduction channel 7. The readout of the data "0" may be performed by detecting the magnitude of the current that flows between the electrodes 1 and 2 as described above. After the readout of data, the electron conduction channel 7 may be made disappear by stopping the application of the readout voltage.

In this case, when the application of a high voltage for the readout results in a sufficient reaction of causing the formation of the electron conduction channel 7, the electron conduction channel 7 may remain as it is even after the stop of the application of the voltage for the readout. In this case, the stop of the application of the voltage for the readout may lead to a state in which the electron conduction channel 7 remains as it is, or alternatively, the application of a voltage (a voltage lower by minus 0.3V, for instance) reverse in polarity to that required for the readout may be performed to allow the electron conduction channel 7 to disappear. The voltage required for the disappearance of the electron conduction channel 7 is lower than that applied to form the electron reaction inhibition layer 4 at the time of the writing. When the application of a relatively low voltage for the readout results in an insufficient reaction of causing the formation of the electron conduction channel 7, the stop of the application of the voltage for the readout causes a linear or strip-shaped precipitation of the silver atom contained in the electron conduction channel 7 and further a diffusion into a region wider than the inside of the inter-electrode material layer 3, and as a result, the electron conduction channel 7 disappears to ensure that the state as shown in FIG. 5(C) is obtained. In this case, it is not necessary to apply a reverse bias voltage for the disappearance of the electron conduction channel 7.

The readout operation in the second embodiment (See FIGS. 6(A) to 6(D)) is the same as that in the first embodiment, and therefore, a detailed description thereof is omitted.

Next, for the readout from the storage element having performed the writing (the state in which the data "1" is stored), the first and the second embodiments perform the application of the same voltage as that in the case of FIGS. 5(A) and 5(B) (the potential higher by about 0.5 V than that of the electrode 2) to the electrode 1. Thus, a series of reactions in which the silver is ionized from the electrode 1 and then precipitates through the acceptance of electrons from the electrode 2 is started. However, the interface between the electrode 2 and the inter-electrode material layer 3 is completely covered with the electrode reaction inhibition layer 4, leading to a failure to accept the electron from the electrode 2 even if the above series of reactions is about to take place (FIG. 7(C)).

Figure 7A:
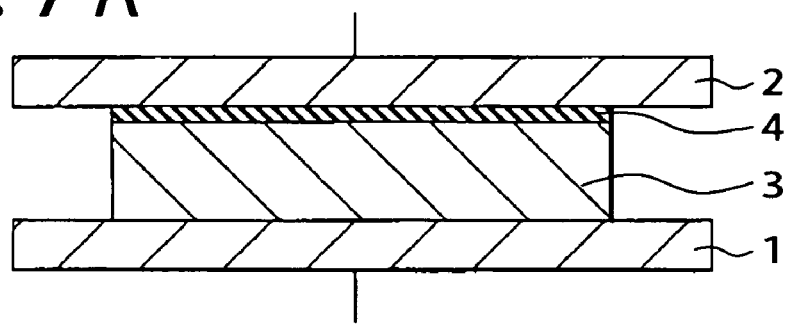
FIGS. 7A to 7C are a sectional view for illustrating the readout operation of data "1" in the storage device according to the first and the second embodiments.
Figure 7B:
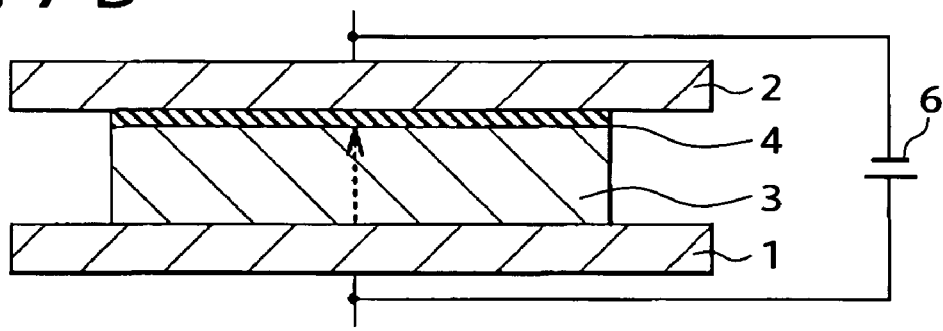
Figure 7C:
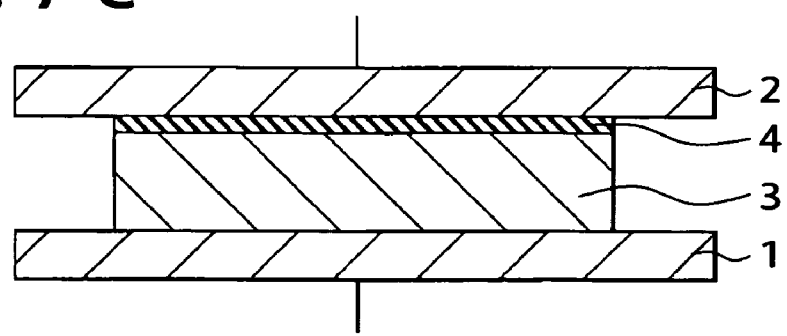

Thus, in the case of the element in which the interface between the electrode 2 and the inter-electrode material layer 3 is completely covered with the electrode reaction inhibition layer 4, neither the above series of reactions nor the formation of the electron conduction channel by the precipitation of the silver is effected. If the interface between the electrode 2 and the inter-electrode material layer 3 is not completely covered with the electrode reaction inhibition layer 4 (the opening is existent partly), the above series of reactions takes place so that the electron conduction channel 7 is formed as shown in FIG. 7(D). However, it becomes difficult to effect the above series of reactions as compared with the case of the non-writing state, in other words, the storage state of the data "0"(FIGS. 1(A) and 2(A)).

With the above mechanisms, in the case of the application of the voltage for the readout to the element that is in the written state, in other words, the storage state of the data "1", the current hardly flows between the electrodes 1 and 2, or although the flow of the current is caused, the magnitude of the current is smaller than that of the current that flows in the case of the application of the voltage for the readout to the element in the non-writing state (the storage state of the data "0"). Thus, the determination of the state of the data stored in the element may be performed.

A detection whether or not the writing process has been applied to the element (or the state of the electron conductivity, the ion conductivity or the capacitance has been changed from that in the case of the non-writing) merely requires, in addition to the application of the above readout voltage, the use of a method typically available for a normal semiconductor device to determine the state of the data stored in the element from the magnitude of the current that flows at the time of the application of the readout voltage, a change of the current with time, or a value obtained by converting the above current into a voltage by the application to a load element.

The readout of the data "1" and "0" is performed with a voltage lower than that required for an electrostatic destruction or a reduction of the electrode reaction inhibition layer 4 at the time of the readout of the state of the data "1".

Erasure Process

Next, an operation at the time of the erasure of the data "1" having been stored through the writing process is described with reference to FIG. 8.

Figure 8A:
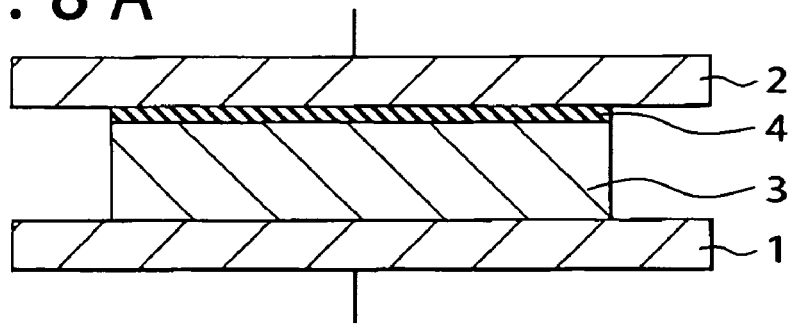
FIGS. 8A to 8D are a sectional view for illustrating an erasure operation of the data "1" in the storage device according to the first embodiment.
Figure 8B:
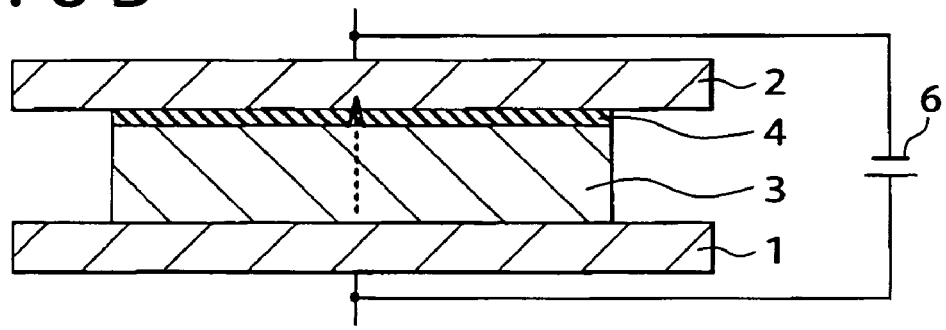

The erasure of the data "1", or the disappearance of the electrode reaction inhibition layer 4 merely requires the application of a reverse voltage to that for the writing to the electrodes 1 and 2. In the first embodiment, the voltage sufficiently higher than that of the electrode 2, or the potential higher by about 1V than that of the electrode 2 is applied to the electrode 1, as shown in FIGS. 8(A) and 8(B). Thus, the electrode reaction inhibition layer 4 on the interface between the electrode 2 and the inter-electrode material layer 3 is electrostatic-destroyed, leading to a loss of the function of inhibiting the reaction of causing cations (silver ions) having been eluted from the electrode 1 to accept the electron from the electrode 2, or is reduced, leading to the disappearance of the electrode reaction inhibition layer 4. Accordingly, the valence of the electrode reaction inhibition material B is changed (increased or decreased) contrary to the case of the writing, resulting in a restoration to the original oxidation-reduction active material A.

Figure 8C:
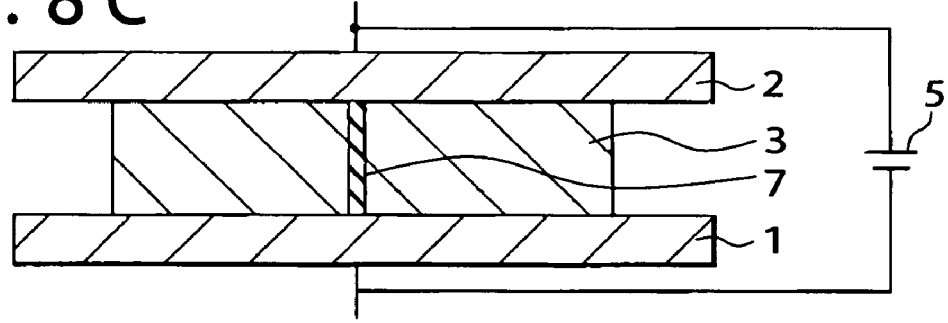
Figure 8D:
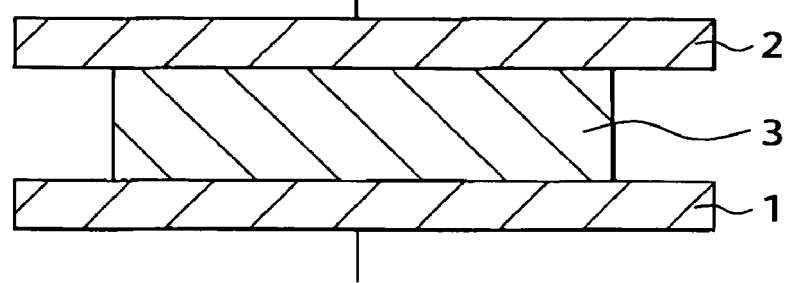
Figure 9A:
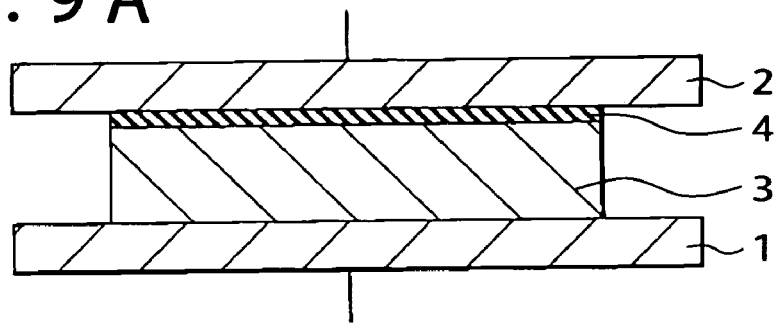
FIGS. 9A to 9D are a sectional view for illustrating the erasure operation of the data "1" in the storage device according to the second embodiment.
Figure 9B:
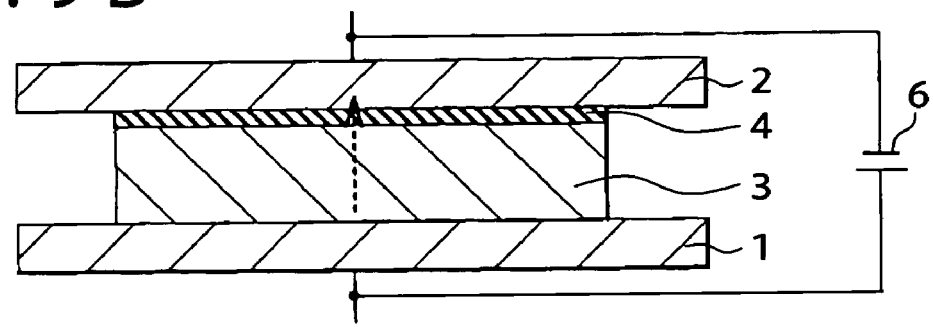
Figure 9C:
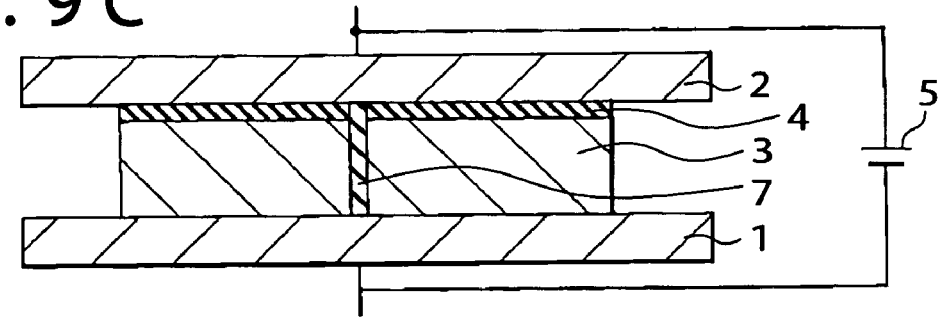
Figure 9D:
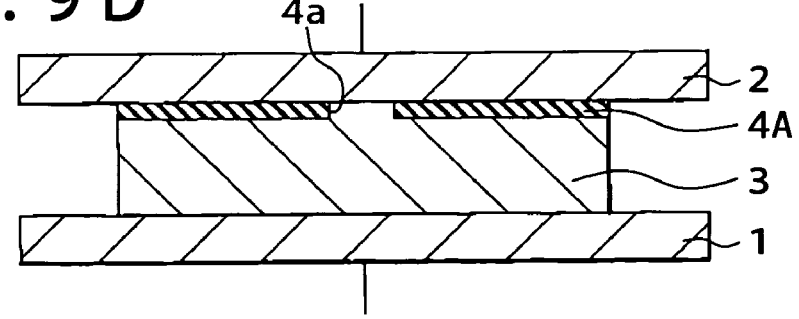

When the application of the voltage as high as that described above to the electrode 1 results in the formation of the electron conduction channel 7 as shown in FIG. 8(C), a potential sufficient to allow the silver having precipitated in the generated electron conduction channel 7 to be eluted, through the ionization, into the inter-electrode material layer 3, or a potential higher by about 0.5V than that of the electrode 1 is then applied to the electrode 2. Thus, the electron conduction channel disappears as shown in FIG. 8(D), which may create the non-writing state, or the state of the data "0".

The erasure operation in the second embodiment (See FIGS. 9(A) to 9(D)) is the same as the above operation, and therefore, a detailed description thereof is omitted.

While the related art system requires the current of the large magnitude at the time of the writing because of the need to form the electron conduction channel of silver, the writing current required for the embodiments of the present invention may be of the small magnitude because of a creation of the different high resistance state with an insulation film (the electrode reaction inhibition layer 4) by applying, to the high resistance element, the voltage in the reverse direction to the flow of the current. Further, all that is required for the erasure is to destroy the electrode reaction inhibition layer 4, so that a current as low as several μA is merely needed. Accordingly, the readout, the writing and the erasing may be performed with the current of the small magnitude, leading to a possibility of the remarkable reduction of the power consumption as compared with the related art.

Figure 10:
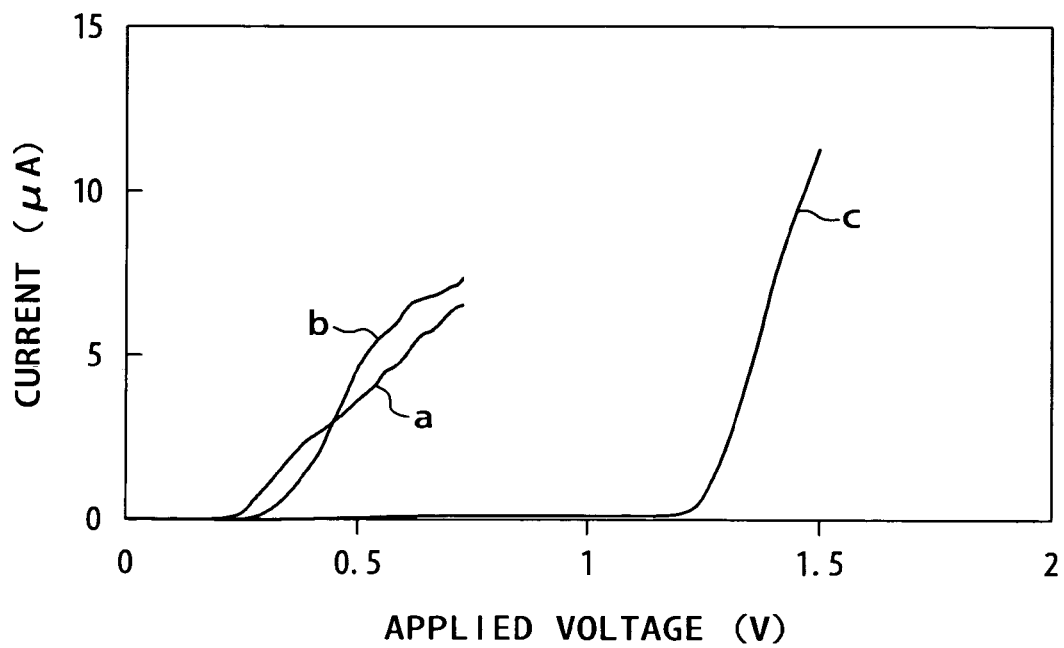
FIG. 10 is a characteristic graph showing a relation between a voltage applied to an electrode and a current before a writing of data and after an erasure of data.

FIG. 10 shows relations before the writing of data and after the erasing between a voltage (V) applied to the electrode 1 and a value of a current (I) having been supplied to the electrode 1. In FIG. 10, curves a and b at a left side respectively represent IV characteristics before the writing and after the erasing. A curve c at a right side represents IV characteristics obtained at the time of the application of a voltage required to attain the erasing of the electron conduction channel through the application of the readout voltage after the writing, and the erasing with the current of several nano-A smaller than 15 μA was proved.

Next, embodiments of the present invention other than the above embodiments are described. In the following, a description on only components substantially different from those of the above embodiments is given without any description on the same components as those of the above embodiments.

Third Embodiment

A third embodiment of the present invention is configured to form a Schottky diode between the electrode 2 and the inter-electrode material layer 3 in the structure shown in FIGS. 2(A) and 2(B), so that the inter-electrode material layer 3 is specified as a p-type semiconductor layer. The Schottky diode permits the current to flow if the application of a negative voltage larger than a threshold value of the diode characteristics to the electrode 2, and conversely, permits no flow of the current if the application of a positive voltage to the electrode 2. A specific material of the inter-electrode material layer 3 includes amorphous silicon (Si) containing a p-type impurity, for instance.

The electrode 1 is formed with a material such as gold (Au) capable of making an electrical contact with the semiconductor material described above. On the other hand, the electrode 2 is formed with the above oxidation-reduction active material A such as nickel (Ni). As described above, the application of the voltage to the electrode 2 including nickel causes the electrode reaction inhibition layer 4 to be formed on the surface of the electrode 2 or in the vicinity of the surface, resulting in the inhibition of the reaction in which the ion, the oxidation-reduction active atom or the oxidation-reduction active molecule existing at the outside of the electrode 2 applies the electron to the electrode 2 or accepts the electron from the electrode 2 as described above.

The third embodiment forms the storage element with the p-type Schottky diode and changes, depending on the presence or not of the electrode reaction inhibition layer 4, a forward current that flows by the application of the voltage exceeding the threshold voltage, thereby allowing the data to be stored. The specific mechanisms of the writing, readout and erasure process of the third embodiment are the same as those of the second embodiment, and therefore, a detained description thereof is omitted.

Fourth Embodiment

While the third embodiment is assumed to form the electrode 2 with the oxidation-reduction active material A, a fourth embodiment of the present invention forms the electrode 2 with a general electrode material such as gold (Au), and allows the oxidation-reduction active material A to be contained in the surface of the electrode 2 or in a region, which is covered by the electric field generated at the time of the application of the voltage to the electrode 2, within the inter-electrode material layer 3 in the vicinity of the surface. The other configuration is the same as that of the third embodiment.

The fourth embodiment also has the inter-electrode material layer 3 formed with the amorphous silicon containing the p-type impurity, and thus shows, in the case of the non-writing state, or the state shown in FIG. 1(A) or 2(A), the diode characteristics in which the decrease of the potential of the electrode 2 than that of the electrode 1 causes the flow of the current, and conversely, the increase of the potential of the electrode 2 than that of the electrode 2 causes no flow of the current. Accordingly, the same IV curve as the IV curves a and b described on the left side of FIG. 10 showing the applied voltage (V)-current (I) characteristics is obtained. The horizontal axis in FIG. 10 shows the voltage of the electrode 1 to the electrode 2, so that positive and negative expressions are reverse to the above expressions.

The writing process applied to the element may be performed as follows.

In the element in the non-writing state, the application of the higher potential than that of the electrode 1 to the electrode 2 causes the oxidation of the oxidation-reduction active material A (nickel) contained in the inter-electrode material layer 3 to be oxidized into the electrode reaction inhibition layer 4 shown in FIG. 1(A) or 2(B). Thus, the transfer of a hole and the electron between the outside of the electrode 2 and the electrode 2 is hindered. This corresponds to the application of the voltage in a negative direction in FIG. 10.

The formation of the electrode reaction inhibition layer 4 as described above results in the decrease of the current that flows at the time of the application of the readout voltage with the decrease of the potential of the electrode 2 than that of the electrode 1. The application of a voltage further higher than the readout voltage causes the destruction of the electrode reaction inhibition layer 4 formed by the writing process, leading to the flow of the current. Accordingly, the same IV curve as the IV curve c described at the right side of FIG. 10 is obtained. The readout of data stored in the element requires the application of a voltage of a magnitude between the above diode threshold voltage and the voltage that causes the increase of the current by the destruction of the electrode reaction inhibition layer 4. When no writing of data is performed to the element, the forward current of the diode is detected. On the other hand, when the writing has been applied to the element, the magnitude of the current to be detected is smaller than that in the non-writing state of the element. Thus, the data stored by the element is read out.

The erasure of the data stored in the element merely requires the application of the voltage that causes the destruction of the electrode reaction inhibition layer 4 formed by the writing process, or the voltage higher than the voltage for the destruction, likewise the first embodiment. The destruction of the electrode reaction inhibition layer 4 allows, in the case of the application of the above readout voltage, the flow of the same forward current of the diode as that in the non-writing state. Thus, the element is restored to the state in which the erasure of the stored data is attained, or the non-writing state.

While the description of the present invention has been given through the above embodiments, it should be understood that the present invention is not limited to the above embodiments, and various changes may be made. While the above embodiments are assumed to form the electrode 1 with silver, for instance, any material including an electron conductive material may be used as long as it is effective in being eluted, through the ionization, by the application of the positive potential and then precipitating through the acceptance of electrons from the facing electrode (the electrode 2) after the transfer through the inter-electrode material. The available materials include the copper (Cu) and zinc (Zn), for instance.

Further, in the above embodiments, nickel (Ni) is used as the oxidation-reduction active material A to configure the electrode 2. Alternatively, metals, which may be formed on the surface of the electrode as the electrode reaction inhibition layer with the valence increased by the application of the positive potential, such as aluminum (Al), titanium (Ti), tantalum (Ta), chromium (Cr), cobalt (Co), or alternatively, semiconductors such as silicon (Si) and germanium (Ge) may be used.

While the above embodiments have been described by defining the case of the formation of the electrode reaction inhibition layer 4 (or the transition of the resistance between the electrodes from the low resistance state to the high resistance state) as the data writing, and the case of the destruction of the electrode reaction inhibition layer 4 (the transition from the high resistance state to the low resistance state) as the data erasing, it should be understood that, provided that the electrode reaction inhibition layer is existent originally before the writing, the destruction of the electrode reaction inhibition layer (the transition from the high resistance state to the low resistance state) may be defined as the writing, and a reformation of the electrode reaction inhibition layer (the transition from the low resistance state to the high resistance state) may be defined as the erasing or erasure.

The storage device according to the present invention is effectively used for a device such as a mobile computer driven by a battery, for instance, and requiring a small power consumption, and, in particular, is available for a nonvolatile programmable device.

It should be understood by those skilled in the art that various modifications, combinations, sub-combinations and alterations may occur depending on design requirements and other factors insofar as they are within the scope of the appended claims or the equivalents thereof.

What is claimed is:

1. A storage device comprising:
   a first electrode;
   a second electrode facing the first electrode;
   an inter-electrode material layer provided between the first electrode and the second electrode; and
   a voltage application unit applying a predetermined voltage to the first and the second electrodes; wherein
   an oxidation-reduction active material changeable into an electrode reaction inhibition layer by applying voltages to the first and the second electrodes is contained in a region that is covered by an electric field, the electric field being generated when the voltage is applied, and
   the electrode reaction inhibition layer is either formed along an interface region between the second electrode and the inter-electrode material layer, or changes an area thereof, or disappears depending on an application condition of the voltage to the first and the second.

2. The storage device according to claim 1, wherein
   the oxidation-reduction active material exists inside or at a surface or in a vicinity of the surface, the surface being of the second electrode at a side to the inter-electrode material layer.

3. The storage device according to claim 1, wherein
the oxidation-reduction active material layer consists of at least one component selected from a group consisting of nickel (Ni), cobalt (Co), chromium (Cr), titanium (Ti), tantalum (Ta), iron (Fe), aluminum (Al), vanadium (Va), a reductant ($H_xWO_3$) of tungsten oxide ($WO_3$), and an oxide of vanadium (V).

4. The storage device according to claim 1, wherein
the inter-electrode material layer has a property such that a resistance thereof decreases at a predetermined threshold voltage or above if a readout voltage is applied to the first and the second electrodes, and
the threshold voltage changes in response to the application of a writing or an erasing voltage to the first and the second electrodes.

5. The storage device according to claim 1, wherein
the inter-electrode material layer has, as a matrix material, an amorphous thin film containing at least one element selected from a group consisting of oxygen (O), sulfur (S), selenium (Se) and tellurium (Te) (chalcogenide material), and at least one element selected from a group consisting of germanium (Ge), silicon (Si), antimony (Sb) and indium (Ir).

6. The storage device according to claim 5, wherein
silver (Ag) or copper (Cu) containing an oxidation-reduction seed is added to the inter-electrode material layer.

7. The storage device according to claim 6, wherein
the oxidation-reduction seed is silver (Ag) or copper (Cu).

8. The storage device according to claim 5, wherein
the first electrode contains the oxidation-reduction seed, and
the second electrode contains the oxidation-reduction active material.

9. The storage device according to claim 1, wherein
no electrode reaction inhibition layer exists at an interface between the second electrode and the inter-electrode material layer before the application of the voltage to the first and the second electrodes, and
the electrode reaction inhibition layer is formed over an entire region of the interface between the second electrode and the inter-electrode material layer after the application of the voltage to the first and the second electrodes.

10. The storage device according to claim 1, wherein
the electrode reaction inhibition layer with an opening is formed at an interface between the second electrode and the inter-electrode material layer before the application of the voltage to the first and the second electrodes, and
the electrode reaction inhibition layer is formed over an entire region of the interface between the second electrode and the inter-electrode material layer after the application of the voltage to the first and the second electrodes.

11. The storage device according to claim 1, wherein
the inter-electrode material layer is formed with a semiconductor with one conductive type, and forms a Schottky diode in conjunction with the second electrode.

12. The storage device according to claim 1, further comprising:
an active element controlling electrical access to the storage element.

13. The storage device according to claim 1, wherein
the storage device is provided with data writing and readout functions.

14. The storage device according to claim 1, wherein
the storage device is provided with an erasure function of written-data in addition to data writing and readout functions.

15. The storage device according to claim 1, wherein
the electrode reaction inhibition layer is formed by an oxidation of a surface of the second electrode by applying a positive potential than that of the first electrode to the second electrode with the voltage application unit,
whereby performing a writing or an erasing of data by decreasing a magnitude of current flowing between the first electrode and the second electrode than that of a current flowing prior to the application of the voltage.

16. The storage device according to claim 13, wherein
the electrode reaction inhibition layer is erased by a reduction of the surface of the second electrode by applying a negative potential than that of the first electrode to the second electrode with the voltage application unit,
whereby performing an erasing or a writing of data by increasing the magnitude of current flowing between the first electrode and the second electrode than that of the current flowing prior to the application of the voltage.

17. The storage device according to claim 1, wherein
the inter-electrode material layer is caused to make a transition to a high resistance state at least before a next readout, and after a writing of data by making a transition of the inter-electrode material layer between the first and the second electrodes from the high resistance state to a low resistance state with the voltage application unit, or, after a readout of data by the application of a voltage equal to or above a threshold value to the first and the second electrodes.

* * * * *